United States Patent

Popper

[15] 3,678,293

[45] July 18, 1972

[54] SELF-BIASING INVERTER

[72] Inventor: Jay D. Popper, Queens, N.Y.

[73] Assignee: General Instrument Corporation, Newark, N.J.

[22] Filed: Jan. 8, 1971

[21] Appl. No.: 104,988

[52] U.S. Cl. ..............................307/214, 307/251, 307/304, 307/205

[51] Int. Cl. ..........................................................H03k 19/40

[58] Field of Search ..............307/214, 304, 279, 251, 221 C, 307/205, 246, 205, 214, 221, 307

[56] References Cited

UNITED STATES PATENTS

| | | | |
|---|---|---|---|
| 3,500,062 | 3/1970 | Annis | 307/304 |
| 3,483,398 | 12/1969 | Murphy et al. | 307/214 |
| 3,255,364 | 6/1966 | Warner, Jr. | 307/304 |
| 3,513,365 | 5/1970 | Levi | 307/251 |
| 3,523,284 | 8/1970 | Washizuka | 340/173 |
| 3,392,341 | 7/1968 | Burns | 330/13 |
| 3,296,547 | 1/1967 | Sickles | 307/246 |

OTHER PUBLICATIONS

Dennard " FET MemCell Using Diodes as Load Devices" IBM Tech. Discl. Bull. Vol. 11, No. 6, Nov. 1968 pages 592–593

*Primary Examiner*—Donald D. Forrer
*Assistant Examiner*—R. E. Hart
*Attorney*—James and Franklin

[57] ABSTRACT

A self-biasing inverter circuit comprises a load device and a semiconductor driving field effect transistor connected in series with a low-impedance device across a voltage source. The input is impressed on the gate terminal of the driving FET and the output is taken off the junction between the driving FET and the load device. A second field effect transistor having a high output impedance is connected between the source of the driving FET and the negative side of the voltage source and has its gate terminal connected to the inverter output. In this manner the source of the driving FET is biased to a negative voltage level sufficient to maintain said driving FET in the nonconductive state even for logic "O" signal more negative than threshold. In addition the bias signal is automatically diminished as a logic "1" input is impressed on the gate of the driving FET to aid in rendering the driving FET conductive.

17 Claims, 3 Drawing Figures

INVENTOR
JAY D. POPPER
BY James Franklin
ATTORNEY

SELF-BIASING INVERTER

This invention relates to logic circuits and more particularly to high speed digital circuits having ambiguous data inputs.

In recent years a new technology has been developed in the semiconductor art in which a plurality of switching devices are fabricated to form an integrated circuit on a chip of semiconductor material. In the fabrication of these circuit chips, and particularly where utilized in digital applications, insulated gate field effect transistors (FETS) have been found to be particularly effective as high speed switching and memory devices. These transistors are formed on a chip of semiconductor material by performing appropriate operations on suitably doped regions of the semiconductor substrate to produce the basic elements of the individual field effect devices. These elements include a control terminal generally termed the gate, and a pair of output terminals generally termed the source and drain respectively. In one type of field effect device, if the signal at the gate is sufficiently negative with respect to its source terminal, the output circuit between the source and drain is closed, that is, the device is conductive or "on." If, on the other hand, the signal at the gate is not sufficiently negative with respect to the source terminal, the output circuit is characterized by an extremely high impedance equivalent to an open circuit, that is, the device is nonconductive or "off". Thus, the FET operates as a high-speed switching device controlled by the signal level applied at its gate terminal. The voltage differential between source and gate at which switching occurs is generally referred to as the threshold voltage ($V_T$) of the device.

For purposes of explanation throughout this specification, an unambiguous logic 0 signal level refers to a level sufficient to turn a field effect device fully off when applied at its gate terminal and an unambiguous logic 1 signal level refers to a level which is sufficient to turn a device fully "on" when applied to its gate terminal.

These devices, by virtue of their extremely small size, low power requirement and ease of fabrication in large quantities, are extremely well suited for the mechanization of complex logic functions on a single substrate of semiconductor material. Moreover, these devices have been found to give consistently higher processing yields than today's bipolar technology.

One of the most serious deficiencies of field effect devices, and particularly metal oxide silicon (MOS) devices, is the requirement of a high voltage swing for effective switching. Thus, a recurrent problem in logic circuits utilizing MOS is that of insuring against data output signals which are not sufficiently above or below threshold to turn the next stage or function "on" or "off" respectively to the extent required. (Throughout this specification the negative logic terminology previously described will be utilized.) In this regard, "above" threshold means sufficiently negative so that the potential difference between the source (normally grounded) and gate terminals is greater than the threshold voltage of the device. Similarly "below" threshold means having a potential less negative than threshold (the source again being considered at ground). Likewise the terms "high" and "low" refer to signals which are more negative (towards logic 1) and less negative (towards logic 0), respectively. The necessity of clearly defined, or unambiguous logic 0 and logic 1 signal levels will be apparent when it is considered that a weak or ambiguous logic input signal (insufficient to turn the device fully "on" or fully "off") may result in an uncertain output signal. This is particularly true of large scale integrated circuits such as digital memory banks employing extremely long logic chains (such as shift registers). In this case it will be appreciated that weak or ambiguous input data signals are propagated throughout the logic chain and may result in the emergence at the output terminal of a data signal at the opposite logic level from that required.

Because of the importance of clearly defined signal levels it is imperative that data signals be taken off nodes designed to be effectively and fully charged or discharged to the two logic levels respectively. In MOS logic circuits of the type here under consideration a reference voltage source at a given negative level (unambiguous logic 1 level) is provided and the source of the switching or driving FET is usually connected to the semiconductor substrate and grounded (unambiguous logic 0 level). The drain is connected to the negative reference potential through a load resistor. The input data signal is impressed upon the gate and the output is taken off the junction node between the load device and the switching or driving FET. If the input signal is at zero potential, no current flows through the switching device (the device is fully "off") and the output node is charged substantially to the negative potential. When the input is at the negative reference voltage current flows through the switching device and the voltage level at the output node is determined by the voltage divider action of the load device-switching device series circuit. Thus, in the case of the above-described inverter stage, the actual level of a logic 1 signal appearing at the output is controlled by the impedance ratio of the two devices. If the impedance ratio is too low, the voltage level at the output will not be sufficiently near ground (unambiguous logic 0) to turn the device fully "off." However, the design of the devices to produce the desired impedance ratio is considerably limited by space and layout requirements. This is particularly true where, as in D.C. memory systems, for example, the drain of the driving FET must be connected to ground through additional field effect devices. Thus it is often not possible to design the circuit to produce a strong unambiguous logic 0 at the output terminal without making other concessions to space and layout requirements.

Accordingly, it is a primary object of the present invention to design a logic circuit having semiconductor switching devices including means to insure effective switching even on relatively weak input signals.

It is a further object of the present invention to design a self-biasing logic circuit having means to bias the operative switching device to ensure effective switching at relatively low voltage swings.

It is yet another object of the present invention to provide a self-biasing logic circuit of the type described wherein the bias signal is controlled by the logic output signal, thereby producing a regenerative effect.

It is still another object of the present invention to design a self-biasing logic circuit for use on semiconductor integrated circuit chips which is inexpensive to manufacture and takes up a minimum of space on the chip.

To these ends the present invention comprises a self-biasing inverter circuit having a switching or driving field effect transistor connected in series with a load device across a reference voltage source. Means are provided to bias the source terminal of the switching device in a negative direction to decrease the gate-to-source driving potential. As a result, weak logic 0 signals considerably more negative than ground are effective to fully turn off the device.

The biasing circuit comprises a load bias FET connected in series with a second low impedance switching FET across the reference voltage source, the junction node therebetween being connected to the source of the driving FET. The gate of the second low impedance FET is connected to the negative potential, thereby to maintain the device conductive. The gate of the load bias FET is connected to the output node of the inverter. As a result, as the driving device is rendered less conductive by a weak logic 0 input the bias load device is rendered more conductive by the output signal, thereby providing a negative bias to the source of the driver in a regenerative fashion to fully turn "off" the driver. When the input is at logic 1 the output turns the bias FET "off" thereby to remove the negative bias, again in a regenerative fashion.

To the accomplishment of the above, and to such other objects as may hereinafter appear, the present invention relates to a self-biasing logic circuit, as defined in the appended claims and as described in this specification, taken together with the accompanying drawings, in which:

Figures 1, 2:
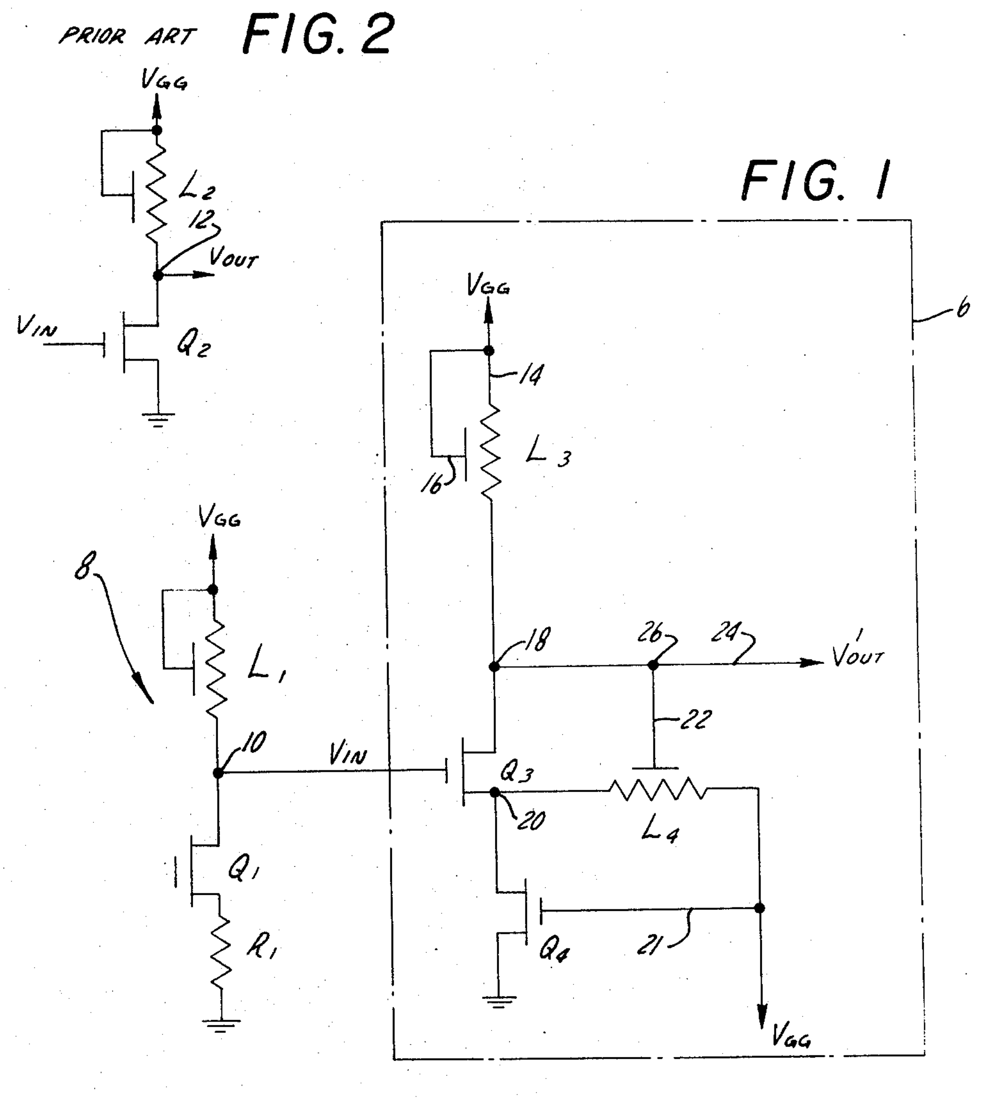
FIG. 1 is a circuit diagram of the logic circuit of the present invention illustrating the input from the previous stage.
FIG. 2 is a circuit diagram of a conventional MOS inverter circuit.

The circuit of the present invention is enclosed in the broken rectangle generally designated 6 in FIG. 1. As there illustrated circuit 6 is adapted to perform the inversion or NOT function. Accordingly, the circuit may comprise an inverter stage of a shift register, a memory system or even part of the arithmetic section of a computer. The data input signal is generated by the previous stage generally designated 8 in the conventional manner. Thus, in the stage 8 a load device $L_1$ is connected in series with a switching FET $Q_1$ and a resistance $R_1$ between the negative voltage source $V_{GG}$ and ground. Load device $L_1$ is typically a high impedance MOSFET having its drain returned to its gate electrode. FET $L_1$ thus functions as a high impedance diode. In a typical system $V_{GG}$ is −28 volts. The level of the output signal at node 10 depends upon the conductivity of FET $Q_1$. Thus, when FET $Q_1$ is fully "off" (nonconductive) node 10 charges substantially to the $V_{GG}$ voltage level and will remain in that condition as a result of the interelectrode capacitances of its associated field effect devices. Conversely if FET $Q_1$ is rendered conductive, current will flow from the $-V_{GG}$ voltage source to ground via load device $L_1$, FET $Q_1$ and resistor $R_1$, producing a voltage division at node 10 dependent upon the impedance ratio of the three series connected devices. In this regard it should be noted that resistor $R_1$ is representative of the combined maximum impedance of the devices which may be connected between FET $Q_1$ and ground. For example, stage 8 may comprise a section of a memory system in which case $R_1$ would represent a decoder having up to 60 FETS connected in parallel between FET $Q_1$ and ground. In a typical case the connection to ground will be made at one end of a long P-region which serves as the common source for all of the devices forming the decoder. Thus, when the decoder FET farthest from the ground connection is conductive, the entire P-region is connected in the circuit and results in a substantial IR drop between FET $Q_1$ and ground. The impedance ratio of the series connected devices may be controlled to some extent by an appropriate design of the channel width-to-length ratio of load FET $L_1$ (the smaller the channel width-to-length ratio the larger the resistance of the device). It will be appreciated, however, that the size of FET $L_1$ is limited by other factors such as speed, space and layout requirements. Accordingly the logic 0 output at node 10 may be too high (up to −6 volts) to fully turn "off" the input FET at the next stage.

This is best illustrated in FIG. 2 which shows a conventional MOS inverter circuit comprising a load FET $L_2$ connected in series with a switching FET $Q_2$ between $V_{GG}$ and ground. The load FET has its drain terminal returned to its gate terminal and again functions as a high impedance diode in known manner. The output $V_{out}$ is taken off node 12 at the junction between FETS $L_2$ and $Q_2$. The operation of this circuit is best described with reference to FIG. 3 accompanied by a brief discussion of the construction and operation of MOSFETS.

A typical MOSFET (P channel enhancement mode) comprises an N-type silicon substrate with two highly doped P-type spaced regions defused therein defining the source and drain. A thin insulating material, typically silicon dioxide, is disposed over the silicon substrate between the source and drain forming the gate dielectric, upon which the gate electrode is disposed.

Referring to FIG. 2, if the gate of FET $Q_2$ is at zero potential, no current flows from source to drain because the P-N junctions are reverse biased. However, as the gate is made more negative, more and more positively charged holes are induced into the region at the substrate surface (the channel) to compensate for the N-type doping of the substrate. When enough holes have accumulated in the channel region the surface of the silicon is changed from electron-dominated to hole-dominated material and is said to have inverted, i.e., the channel changes from N-type to P-type material and ohmic conduction occurs through the channel between source and drain. Making the gate more negative drives the inversion layer deeper and increases conduction.

Figure 3:
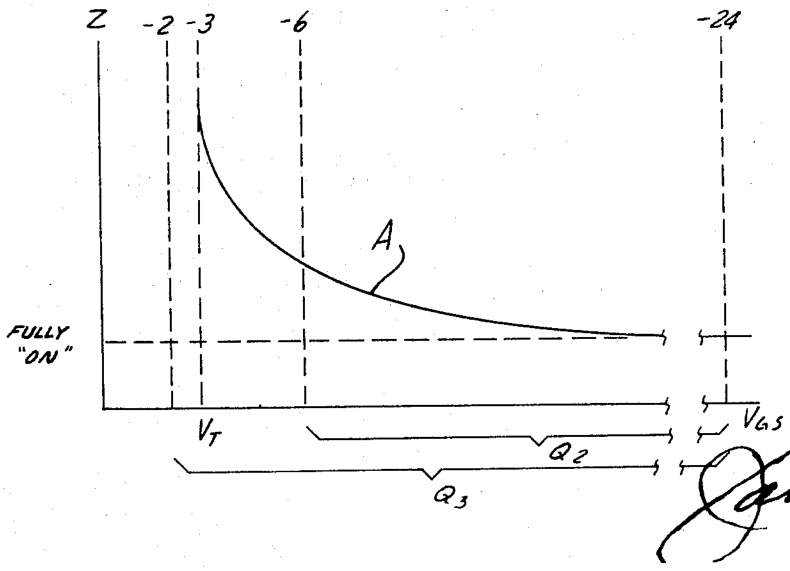
FIG. 3 is a graphical representation of device impedance plotted against gate-to-source voltage for a threshold voltage of −3 volts.

FIG. 3 shows a plot of impedance Z versus gate-to-source voltage, $V_{GS}$ (increasing negatively to the right) for a typical low-threshold P channel enhancement mode MOSFET. As there shown, as the negative gate voltage is increased, impedance decreases first rapidly, then less rapidly and finally tends to level off at some low, "on" value (obeying a square law). If $V_{GS}$ is made more positive, impedance increases first slowly, then more rapidly and finally tends to approach infinity at a given value of $V_{GS}$. This is the level at which effective switching takes place and is known as the threshold voltage $V_t$ of the device.

$V_t$ is generally determined at the time of fabrication of the particular device and is a function of such factors as doping levels, oxide thickness and dielectric constant, and the particular metal used as the gate electrode. These factors in turn are determined fairly narrowly by other desired operating characteristics and the limitations of the manufacturing process. However, $V_t$ is also a function of surface state charge density ($Q_{ss}$), a measure of the degree of atomic disorder at the silicon-oxide interface. This factor is not as easily controlled, and thus $V_t$ commonly varies in devices integrated on different chips. Moreover, $Q_{ss}$ is not necessarily constant during operation in devices on a given chip. Accordingly, the nominal spread of MOS threshold voltages for high-threshold devices processed in a well controlled line is from approximately −3 to −5 volts. As shown in FIG. 3 curve A represents the impedance characteristic of a typical low-threshold MOSFET having a threshold voltage of −3 volts.

Referring again to FIG. 2 the operation of the inverter circuit there illustrated will now be apparent. When the data input signal Vin is at an unambiguous logic 1, FET $Q_2$ is fully conductive, current flows from $V_{GG}$ to ground via load device $L_2$ and FET $Q_2$, and the voltage divider action results in an output signal, Vout, at the logic 0 level. If the data input signal, Vin, is at an unambiguous logic 0 level FET $Q_2$ is rendered fully nonconductive and the output node 12 is charged substantially to the negative voltage source level $V_{GG}$. (It should be noted at this point that in typical MOSFET circuits the charging of a node through a load device such as $L_2$ in FIG. 2 results in a voltage level approximately one threshold voltage drop from the charging source, $V_{GG}$. Thus if $V_{GG}$ is at −28 volts and the threshold voltage of $L_2$ is −3 volts, load FET $L_2$ will be rendered nonconductive when its source terminal node 12 is charged to approximately −25 volts.)

However, as previously described with respect to stage 8 of FIG. 2, Vin may be at a weak logic 0 signal level (−6 volts). It will be apparent from an inspection of FIG. 3 that a Vin at this level will not be effective to render FET Q2 fully nonconductive. Thus some current will flow through FET $Q_2$, thereby discharging node 12 so that output signal Vout may be considerably less than the expected −25 volt logic 1 output. Consequently, the output signal Vout when applied to the gate terminal of the input FET of the next stage will not be effective to fully turn "on" that input device and the ambiguous output is thus propogated throughout the system and may result in erroneous data signals throughout.

Referring now to FIG. 1 it will be seen that the self-biasing inverter circuit 6 of the present invention comprises a load FET $L_3$ and a switching FET $Q_3$ connected in series in the usual manner between the $V_{GG}$ source and ground. The load device $L_3$ is again shown as a load FET having its drain terminal 14 returned to its gate terminal 16. Switching FET $Q_3$ receives the data input signal Vin at its gate terminal, the output signal Vout'' being taken off the junction of the output circuits of FETS $L_3$ and $Q_3$ at node 18.

Means to negatively bias the source terminal of FET $Q_3$ are provided in the form of a load FET $L_4$ connected in series with a switching FET $Q_4$ between the $V_{GG}$ reference voltage source and ground. The source terminal of FET $Q_3$ is connected to this circuit at the junction of the output circuits of FETS $L_4$ and $Q_4$ at node 20. The gate terminal 21 of FET $Q_4$ is tied to the $V_{GG}$ source, whereby FET $Q_4$ serves as a low-impedance device between node 20 and ground. FET $L_4$ is a relatively high-impedance device having its gate terminal 22 connected to the output line 24 at node 26.

The operation of the circuit will now be described with reference being made to FIG. 3. When the input signal Vin is at logic 1 (−25 volts) FET Q3 is rendered fully conductive and current flows from the negative voltage source $V_{GG}$ to ground via conductive FETS $L_3$, $Q_3$ and $Q_4$. As a result of the voltage divider action between load FET $L_3$ and low-impedance switching FETS $Q_3$ and $Q_4$, the output voltage level Vout at node 18 is drawn towards ground. Since the gate 22 of load FET $L_4$ receives the output signal Vout′, load FET $L_4$ is rendered fully nonconductive and current is blocked from the $V_{GG}$ source through said load FET $L_4$ to node 20.

As Vin moves positively (toward logic 0) the impedance of FET $Q_3$ increases as a result of the decrease of the driving voltage $V_{GS}$ (moving from right to left in FIG. 3). Accordingly node 18 begins to move toward the $V_{GG}$ negative level in response to the reduced impedance ratio of FET $L_3$ to FETS $Q_3$ and $Q_4$. When the voltage drop across FET $Q_3$ (the potential difference between nodes 18 and 20) exceeds the threshold voltage of FET $L_4$ (i.e. −3 volts), the impedance of FET $L_4$ is lowered in accordance with the curve shown in FIG. 3 (moving to the right); current begins to flow through the bias circuit (FETS $L_4$ and $Q_4$) from $V_{GG}$ to ground whereby the voltage divider action between FETS $L_4$ and $Q_4$ is effective to move the voltage level at node 20 negatively. This in turn decreases the driving voltage $V_{GS}$ between the gate and source terminals of FET $Q_3$ to aid in rendering it nonconductive. It will be appreciated that this process is regenerative in nature. Thus, as the impedance of FET $Q_3$ rises (turning off), the impedance of FET $L_4$ drops (turning on) which in turn is effective to decrease the turn "on" drive of FET $Q_3$ (turning off).

The system will eventually stabilize in a condition which is determined by the relative values of the "on" impedances of FETS Q3, $Q_4$, $L_3$ and $L_4$. For example, if logic 0 inputs of up to −6 volts are expected for low threshold voltages of approximately −3 volts, it will be necessary to bias node 20 to approximately −4 volts to reduce $V_{GS}$ to −2 volts which is 1 volt below threshold (see FIG. 3). This will be effective to render FET $Q_3$ fully non-conductive, thereby to produce the desired logic 1 output signal Vout (approximately −25 volts) at node 18. However, it is also necessary to bring node 18 down to less than −3 volts to produce an unambiguous logic 0 output when Vin is at logic 1. Consequently FET $L_3$ is typically designed for an "on" impedance of at least 10 times the value of the combined "on" impedances of switching FETS $Q_3$ and $Q_4$. FETS $Q_3$ and $Q_4$ normally are both designed for the lowest possible "on" impedance within the practical capability of the manufacturing process and are therefore approximately equal in this respect. Accordingly, when both FETS $Q_3$ and $Q_4$ are fully conductive, the voltage drop across each is approximately 1 volt, resulting in a −2 volt logic 0 output at node 18. In order to effect the required negative bias at node 20 when Vin is at a weak or ambiguous logic 0, FET $L_4$ should have an "on" impedance which is approximately 6 times greater than the "on" impedance of FET $Q_4$. Thus, the resulting voltage divider action of the bias circuit will produce a voltage drop across FET $L_4$ of approximately 24 volts and a voltage drop across FET $Q_4$ of approximately 4 volts, when FET $Q_3$ is turned "off." Consequently, when Vin goes to −6 volts, node 18 moves negatively to initiate the regenerative self-biasing effect and FET $L_4$ is eventually rendered fully conductive (at its "on" impedance) moving node 20 negatively to −4 volts; $V_{GS}$ is −6−(−4) or − 2 volts, which as shown by curve A in FIG. 3 is sufficiently positive to turn FET Q3 completely "off." As a result node 18 is charged sufficiently negative (i.e. −25 volts) so that Vout is sufficiently positive to render the next input FET fully conductive.

It will be appreciated from the foregoing that a self-regenerative bias of any desired value may be produced at node 20 for a weak or ambiguous logic 0 input signal merely by designing FET $L_4$ with the appropriate "on" impedance. In this manner a logic circuit may be easily and inexpensively adapted to produce a relative high output voltage swing defining unambiguous logic levels even in response to ambiguous input data. As a result the propagation of ambiguous data signals is effectively eliminated and layout, space and speed requirements may be used as the sole determining factors in design of integrated circuit chips without the significant problems of output voltage swing heretofore encountered.

The foregoing bias circuit has been described specifically as applied to a conventional MOS inverter. It will be appreciated, however, that bias circuits of this type may be extremely useful in all digital logic applications in which signal level swing must be considered in avoiding ambiguous data outputs.

While only a single preferred embodiment of the present invention is herein specifically described, it will be appreciated that many variations may be made therein all within the scope of the present invention as defined in the following claims.

I claim:

1. In a self-biasing logic circuit having an input port, an output port, and a source of first and second reference voltage levels, a first semiconductor switching device having a control terminal and first and second output terminals, said output terminals of said first switching device being operatively connected between said first and second reference voltage levels, a second semiconductor switching device having a control terminal and first and second output terminals, said output terminals of said second switching device being connected between said first output terminal of said first switching device and said source of said first voltage level, said second output terminal of said first switching device being operatively connected to said control terminal of said second switching device, said control terminal of said first switching device being connected to said input port independently of said second switching device, said output port being defined at the junction of said second output terminal of said first switching device and said control terminal of said second switching device, whereby application of a signal at said input port sufficient to change the conductance of said first switching device in a given sense is effective to change the conductance of said second switching device in the opposite sense thereby to increase the driving potential across said control terminal and said first output terminal of said first switching device.

2. The logic circuit of claim 1, wherein said first switching device has a relatively low output impedance and said second switching device has a relatively high output impedance.

3. The logic circuit of claim 1, wherein said first semiconductor switching device is a field effect transistor, said control terminal thereof comprising the gate electrode thereof.

4. The logic circuit of claim 2, wherein said first semiconductor switching device is a field effect transistor, said control terminal thereof comprising the gate electrode thereof.

5. The logic circuit of claim 1, wherein said second semiconductor switching device is a field effect transistor, said control terminal thereof comprising the gate electrode thereof.

6. The logic circuit of claim 2, wherein said second semiconductor switching device is a field effect transistor, said control terminal thereof comprising the gate electrode thereof.

7. The logic circuit of claim 3, wherein said second semiconductor switching device is a field effect transistor, said control terminal thereof comprising the gate electrode thereof.

8. The logic circuit of claim 1, further comprising a third semiconductor device connected between said first output terminal of said first semiconductor switching device and a source of said second voltage level, whereby when said second semiconductor switching device is conductive current flows through said second and third semiconductor devices to bias said first output terminal of said first semiconductor switching device to a given voltage level between said first and second voltage levels and when said second semiconductor switching device is rendered nonconductive, the voltage level at said first output terminal of said first semiconductor switching device moves toward said second voltage level.

9. The logic circuit of claim 8, wherein said first switching device has a low output impedance and said second switching device has a relatively high output impedance.

10. The logic circuit of claim 8, wherein said first semiconductor switching device is a field effect transistor, said control terminal thereof comprising the gate electrode thereof.

11. The logic circuit of claim 8, wherein said second semiconductor switching device is a field effect transistor, said control terminal thereof comprising the gate electrode thereof.

12. The logic circuit of claim 8, wherein said third semiconductor device is a switching device, the control terminal of which is operatively connected to said source of said first voltage level.

13. The logic circuit of claim 1, wherein said input port is adapted to receive signals at first and second logic levels corresponding to said first and second voltage levels, respectively, and further comprising a semiconductor load device connected between said second output terminal of said first switching device and a source of said first voltage level, whereby said logic circuit functions as an inverter.

14. In a self-biasing logic circuit having an input port, an output port and a reference voltage source having first and second reference voltage levels, a first semiconductor switching device having a control terminal and first and second output terminals, said output terminals being operatively connected across said voltage source between said first and second reference voltage levels, impedance means connected between said first output terminal of said first semiconductor switching device and said first reference voltage level of said voltage source, the control terminal of said first semiconductor switching device being operatively connected to said input port, said second output terminal of said first semiconductor switching device being connected to said output port, and means responsive to the signal at said output port for varying the impedance of said impedance means, thereby to vary the voltage level at said first output terminal of said first semiconductor switching device in accordance with the output signal at said output port.

15. The logic circuit of claim 14, wherein said impedance device is a second semiconductor device having a relatively high output impedance, the control terminal of said second semiconductor device being operatively connected to said output port.

16. In a self-biasing logic circuit having an input port, an output port and a source of first and second reference voltage levels, a semiconductor switching device having a control terminal and first and second output terminals, said first output terminal being operatively connected to said source of said first voltage level, said second output terminal being connected to said source of said second voltage level, said control terminal being operatively connected to said input port, and said first output terminal being connected to said output port, and means responsive to the signal level at said output port to bias the other output terminal of said first semiconductor switching device towards said first voltage level.

17. The logic circuit of claim 16, wherein said input port is adapted to receive signals at first and second logic levels corresponding to said first and second voltage levels, respectively, and further comprising a semiconductor load device connected between said first output terminal of said switching device and a source of said first voltage level, whereby said logic circuit functions as an inverter.

* * * * *